United States Patent
Weber (10) Patent No.: US 9,954,093 B2
(45) Date of Patent: Apr. 24, 2018

(54) METHOD OF MANUFACTURING A SUPER JUNCTION SEMICONDUCTOR DEVICE AND SUPER JUNCTION SEMICONDUCTOR DEVICE

(71) Applicant: Infineon Technologies Austria AG, Villach (AT)

(72) Inventor: Hans Weber, Bayerisch Gmain (DE)

(73) Assignee: Infineon Technologies Austria AG, Villach (AT)

( * ) Notice: Subject to any disclaimer, the term of this patent is extended or adjusted under 35 U.S.C. 154(b) by 0 days.

(21) Appl. No.: 15/635,821

(22) Filed: Jun. 28, 2017

(65) Prior Publication Data

US 2018/0006147 A1     Jan. 4, 2018

(30) Foreign Application Priority Data

Jun. 29, 2016 (DE) .......................... 10 2016 111 940

(51) Int. Cl.
*H01L 29/78* (2006.01)
*H01L 29/66* (2006.01)
(Continued)

(52) U.S. Cl.
CPC ........ *H01L 29/7811* (2013.01); *H01L 21/266* (2013.01); *H01L 21/26586* (2013.01);
(Continued)

(58) Field of Classification Search
USPC ......................................................... 438/268
See application file for complete search history.

(56) References Cited

U.S. PATENT DOCUMENTS 6,630,698 B1    10/2003   Deboy et al.
6,724,042 B2    4/2004    Onishi et al.
(Continued)

FOREIGN PATENT DOCUMENTS

DE          10106006 A1       8/2001
DE          10337808 B3       10/2004
DE       102013212787 A1      1/2014

OTHER PUBLICATIONS

Weber, Hans, "Herstellungsverfahren für ein Kompensationsbauelement / Verfahren zur definierten Ladungstrennung bei doppelt dotierter Ausgangsepischicht", Siemens Technik Report, vol. 5, No. 17, Jun. 2002.

*Primary Examiner* — Marcos D Pizarro
*Assistant Examiner* — Lawrence Tynes, Jr.
(74) *Attorney, Agent, or Firm* — Murphy, Bilak & Homiller, PLLC (57) ABSTRACT

A semiconductor device is manufactured by: i) forming a mask on a process surface of a semiconductor layer, elongated openings of the mask exposing part of the semiconductor layer and extending along a first lateral direction; ii) implanting dopants of a first conductivity type into the semiconductor layer based on tilt angle α1 between an ion beam direction and a process surface normal and based on twist angle ω1 between the first lateral direction and a projection of the ion beam direction on the process surface; iii) implanting dopants of a second conductivity type into the semiconductor layer based on tilt angle α2 between an ion beam direction and the process surface normal and based on twist angle ω2 between the first lateral direction and a projection of the ion beam direction on the process surface; and repeating i) to iii) at least one time.

19 Claims, 10 Drawing Sheets

(51) Int. Cl.
*H01L 29/15* (2006.01)
*H01L 21/265* (2006.01)
*H01L 29/06* (2006.01)
*H01L 21/266* (2006.01)

(52) U.S. Cl.
CPC ........ *H01L 29/0623* (2013.01); *H01L 29/157* (2013.01); *H01L 29/66712* (2013.01); *H01L 29/158* (2013.01)

(56) References Cited

U.S. PATENT DOCUMENTS

| | | |
|---|---|---|
| 6,960,798 B2 | 11/2005 | Deboy et al. |
| 8,183,666 B2 | 5/2012 | Schulze |
| 8,653,578 B2* | 2/2014 | Lee .................. H01L 21/26586 257/314 |
| 8,785,306 B2 | 7/2014 | Guan et al. |
| 8,823,084 B2 | 9/2014 | Gamerith et al. |
| 9,076,887 B2* | 7/2015 | Lee ................. H01L 21/823487 |
| 9,711,357 B1* | 7/2017 | Weber ................... H01L 21/033 |
| 2004/0164304 A1* | 8/2004 | Magri ............... H01L 21/26586 257/73 |
| 2008/0067587 A1* | 3/2008 | Gossner ................. H01L 21/84 257/336 |
| 2009/0197382 A1* | 8/2009 | Anderson ......... H01L 21/26513 438/283 |
| 2014/0001514 A1 | 1/2014 | Schulze et al. |
| 2014/0332931 A1 | 11/2014 | Mauder et al. |

* cited by examiner

METHOD OF MANUFACTURING A SUPER JUNCTION SEMICONDUCTOR DEVICE AND SUPER JUNCTION SEMICONDUCTOR DEVICE

BACKGROUND

Semiconductor devices known as charge compensation or super junction (Si) semiconductor devices, for example SJ insulated gate field effect transistors (SJ IGFETs) are based on mutual space charge compensation of n- and p-doped regions in a semiconductor substrate or body allowing for an improved trade-off between area-specific on-state resistance Ron×A and breakdown voltage Vbr between load terminals such as source and drain. Performance of charge compensation of SJ semiconductor devices depends on precision when setting a lateral or horizontal charge balance by the n-doped and p-doped regions. Process technology may cause variations in the desired charge balance targets, for example due to tolerances in dose of doping and lithographic alignment processes.

It is desirable to improve a method of manufacturing a super junction semiconductor device in regard to precise setting of charge balance and to provide a related super junction semiconductor device.

SUMMARY

The present disclosure relates to a method of manufacturing a semiconductor device in a semiconductor body. The method includes i) forming a mask on a process surface of a semiconductor layer, the mask comprising a plurality of elongated mask openings exposing a part of the semiconductor layer, the plurality of elongated mask openings extending along a first lateral direction, and wherein at least some of the plurality of elongated mask openings differ in a width. The method further includes ii) implanting first dopants of a first conductivity type into the semiconductor layer based on a first tilt angle $\alpha 1$ between an ion beam direction and a process surface normal and based on a first twist and $\omega 1$ between the first lateral direction and a projection of the ion beam direction on the process surface. The method further includes iii) implanting second dopants of a second conductivity type into the semiconductor layer based on a second tilt angle $\alpha 2$ between an ion beam direction and the process surface normal and based on a second twist angle $\omega 2$ between the first lateral direction and a projection of the ion beam direction on the process surface. The method further includes iv) increasing a thickness of the semiconductor layer by forming an epitaxial layer. The method further includes repeating i) to iii) at least one time.

The present disclosure also relates to another method of manufacturing a semiconductor device in a semiconductor body. The method includes i) forming a mask on a process surface of a semiconductor layer, the mask comprising a plurality of elongated mask openings exposing a part of the semiconductor layer, the plurality of elongated mask openings extending along a first lateral direction. The method further includes ii) implanting dopants of a first conductivity type into the semiconductor layer based on a first tilt angle $\alpha 1$ between an ion beam direction and a process surface normal and based on a first twist angle $\omega 1$ between the first lateral direction and a projection of the ion beam direction on the process surface. The method further includes iii) implanting dopants of a second conductivity type into the semiconductor layer based on a second tilt angle $\alpha 2$ between an ion beam direction and the process surface normal and based on a second twist angle $\omega 2$ between the first lateral direction and a projection of the ion beam direction on the process surface. The method further includes iv) increasing a thickness of the semiconductor layer by forming an epitaxial layer. The method further includes v) repeating i) to iv) at least one time, wherein the elongated mask openings are staggered to the elongated mask openings previously formed in process i) along a second lateral direction by an offset, and the tilt and twist angles of ii) and iii) are interchanged.

The present disclosure also relates to a semiconductor device. The semiconductor device includes a super junction structure in a semiconductor body. The super junction structure includes a plurality of elongated n- and p-doped regions extending in parallel along a first lateral direction and alternately arranged along a second lateral direction. A width of the elongated n-doped regions successively decreases from one of the elongated n-doped regions in an edge termination area to another one of the elongated n-doped regions in the edge termination area along the second lateral direction.

The present disclosure also relates to another semiconductor device. The semiconductor device includes a super junction structure in a semiconductor body, the super junction structure comprising a plurality of elongated n- and p-doped regions extending in parallel along a first lateral direction and alternately arranged along a second lateral direction. In a first semiconductor area adjoining an outermost of the and p-doped regions along the second direction, a plurality of first n- and doped sub-regions are alternately arranged along an extension of the outermost of the n- and p-doped regions in a vertical direction perpendicular to a plane spanned by the first and second lateral directions.

The present disclosure also relates to yet another semiconductor device. The semiconductor device includes a super junction structure in a semiconductor body, the super junction structure comprising a plurality of elongated regions of a first conductivity type and of a second conductivity type extending in parallel along a first lateral direction and alternately arranged along a second lateral direction. The semiconductor device further includes a field stop region in an edge termination area outside a transistor cell area. The field stop region is of the first conductivity type and includes a dose of dopants of the second conductivity type opposite to the first conductivity type. The dose of dopants of the second conductivity type equals a dose of dopants of the second conductivity type of one of the elongated regions of the second conductivity type measured along a vertical extension between a vertical center and a bottom side of the one of the elongated regions of the second conductivity type.

Those skilled in the art will recognize additional features and advantages upon reading the following detailed description and on viewing the accompanying drawings.

BRIEF DESCRIPTION OF THE DRAWINGS

The accompanying drawings are included to provide a further understanding of the disclosure and are incorporated in and constitute a part of this specification. The drawings illustrate the embodiments of the present disclosure and together with the description serve to explain principles of the disclosure. Other embodiments and intended advantages will be readily appreciated as they become better understood by reference to the following detailed description.

DETAILED DESCRIPTION

In the following detailed description, reference is made to the accompanying drawings, which form a part hereof and in which are shown by way of illustrations specific embodiments in which the invention may be practiced. It is to be understood that other embodiments may be utilized and structural or logical changes may be made without departing from the scope of the present invention. For example, features illustrated or described for one embodiment can be used on or in conjunction with other embodiments to yield yet a further embodiment. It is intended that the present invention includes such modifications and variations. The examples are described using specific language, which should not be construed as limiting the scope of the appending claims. The drawings are not scaled and are for illustrative purposes only. For clarity, the same elements have been designated by corresponding references in the different drawings if not stated otherwise.

The terms "having", "containing", "including", "comprising" and the like are open and the terms indicate the presence of stated structures, elements or features but not preclude the presence of additional elements or features. The articles "a", "an" and "the" are intended to include the plural as well as the singular, unless the context clearly indicates otherwise.

The term "electrically connected" describes a permanent low-ohmic connection between electrically connected elements, for example a direct contact between the concerned elements or a low-ohmic connection via a metal and/or highly doped semiconductor. The term "electrically coupled" includes that one or more intervening element(s) adapted for signal transmission may exist between the electrically coupled elements, for example elements that temporarily provide a low-ohmic connection in a first state and a high-ohmic electric decoupling in a second state.

The Figures illustrate relative doping concentrations by indicating "−" or "+" next to the doping type "n" or "p". For example, "n−" means a doping concentration that is lower than the doping concentration of an "n"-doping region while an "n+"-doping region has a higher doping concentration than an "n"-doping region. Doping regions of the same relative doping concentration do not necessarily have the same absolute doping concentration. For example, two different "n"-doping regions may have the same or different absolute doping concentrations.

The terms "wafer", "substrate", "semiconductor body" or "semiconductor substrate" used in the following description may include any semiconductor-based structure that has a semiconductor surface. Wafer and structure are to be understood to include silicon (Si), silicon-on-insulator (SOI), silicon-on sapphire (SOS), doped and undoped semiconductors, epitaxial layers of silicon supported by a base semiconductor foundation, and other semiconductor structures. The semiconductor need. not be silicon-based. The semiconductor could as well be silicon germanium (SiGe), germanium (Ge) or gallium arsenide (GaAs), According to other embodiments, silicon carbide (SiC) or gallium nitride (GaN) may form the semiconductor substrate material.

The term "horizontal" as used in this specification intends to describe an orientation substantially parallel to a first or main surface of a semiconductor substrate or body. This can be for instance the surface of a wafer or a die.

The term "vertical" as used in this specification. intends to describe an orientation which is substantially arranged perpendicular to the first surface, i.e. parallel to the normal direction of the first surface of the semiconductor substrate or body.

In this specification, second surface of a semiconductor substrate or semiconductor body is considered to be formed by the lower or backside surface while the first surface is considered to be formed by the upper, front or main surface of the semiconductor substrate. The terms "above" and "below" as used in this specification therefore describe a relative location of a structural feature to another In this specification, n-doped is referred to as first conductivity type while p-doped is referred to as second conductivity type. Alternatively, the semiconductor devices can be formed with opposite doping relations so that the first conductivity type can be p-doped and the second conductivity type can be n-doped.

Processing of a semiconductor wafer may result in semiconductor devices having terminal contacts such as contact pads (or electrodes) which allow electrical contact to be made with the integrated circuits or discrete semiconductor devices included in the semiconductor body. The electrodes may include one or more electrode metal layers which are applied to the semiconductor material of the semiconductor chips. The electrode metal layers may be manufactured with any desired geometric shape and any desired material composition. The electrode metal layers may, for example, be in the form of a layer covering an area. Any desired metal, for example Cu, Ni, Sn, Au, Ag, Pt, Pd, and an alloy of one or more of these metals may be used as the material. The electrode metal layer(s) need not be homogenous or manufactured from just one material, that is to say various compositions and concentrations of the materials contained in the electrode metal layer(s) are possible. As an example, the electrode layers may be dimensioned large enough to be bonded with a wire.

In embodiments disclosed herein one or more conductive layers, in particular electrically conductive layers, are applied. It should be appreciated that any such terms as "formed" or "applied" are meant to cover literally all kinds and techniques of applying layers. In particular, they are meant to cover techniques in which layers are applied at once as a whole like, for example, laminating techniques as well as techniques in which layers are deposited in a sequential manner like, for example, sputtering, plating, molding, CVD (Chemical Vapor Deposition), physical vapor deposition (PVD), evaporation, hybrid physical-chemical vapor deposition (HPCVD), etc.

The applied conductive layer may comprise, inter alia, one or more of a layer of metal such as Cu or Sn or an alloy thereof, a layer of a conductive paste and a layer of a bond material. The layer of a metal may be a homogeneous layer. The conductive paste may include metal particles distributed in a vaporizable or curable polymer material, wherein the paste may be fluid, viscous or waxy. The bond material may be applied to electrically and mechanically connect the semiconductor chip, e.g., to a carrier or, e.g., to a contact clip. A soft solder material or, in particular, a solder material capable of forming diffusion solder bonds may be used, for example solder material comprising one or more of Sn, SnAg, SnAu, SnCu, In, InAg, InCu and InAu.

A dicing process may be used to divide the semiconductor wafer into individual chips. Any technique for dicing may be applied, e.g., blade dicing (sawing), laser dicing, etching, etc. The semiconductor body, for example a semiconductor wafer may be diced by applying the semiconductor wafer on a tape, in particular a dicing tape, apply the dicing pattern, in particular a rectangular pattern, to the semiconductor wafer, e.g., according to one or more of the above mentioned techniques, and pull the tape, e.g., along four orthogonal directions in the plane of the tape. By pulling the tape, the semiconductor wafer gets divided into a plurality of semiconductor dies (chips).

FIGS. 1A to 1G are schematic top and cross sectional views of a semiconductor body for illustrating an embodiment of a method of manufacturing a super junction semiconductor device.

It will be appreciated. that while method is illustrated and described below as a series of acts or events, the illustrated ordering of such acts or events are not to be interpreted in a limiting sense. For example, some acts may occur in different orders and/or concurrently with other acts or events apart from those illustrated and/or described herein. In addition, not all illustrated acts may be required to implement one or more aspects of embodiments of the disclosure herein. Also, one or more of the acts depicted herein may be carried out in one or more separate act and/or phases.

Figure 1A:
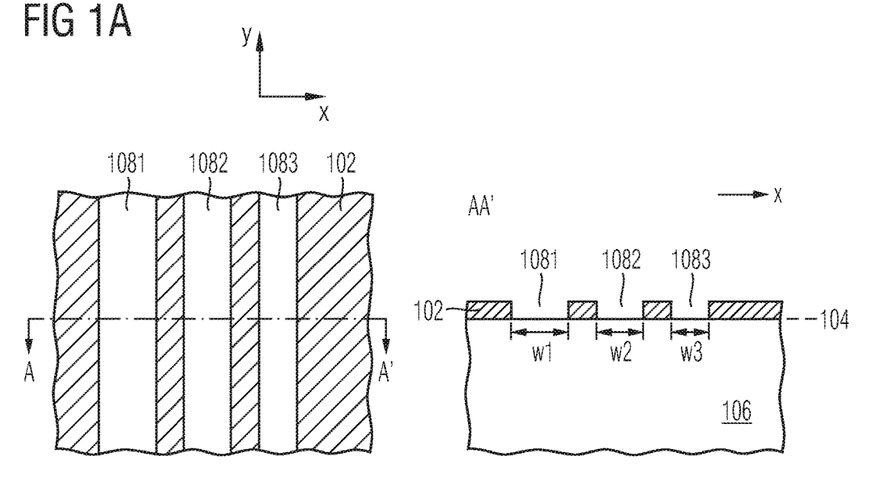
FIG. 1A are schematic top and cross sectional views of a semiconductor layer after forming a mask comprising elongated mask openings on a process surface.

Referring to the schematic top and cross sectional views of FIG. 1A, a mask 102 is formed on a process surface 104 of a semiconductor layer 106. The mask 102 includes a plurality of elongated mask openings exposing a part of the semiconductor layer 106. First to third elongated mask openings 108$_1$, 108$_2$, 108$_3$ constitute part of the plurality of the elongated mask openings. The first to third elongated mask openings 108$_1$, 108$_2$, 108$_3$ extend along a first lateral direction y. At least some of the plurality of elongated mask openings differ in a width. In the illustrated portion of the semiconductor layer 106, a first width w1 of the first elongated mask opening 108$_1$ is larger than a second width w2 of the second elongated mask opening 108$_2$. The second width w2 of the second elongated mask opening 108$_2$ is larger than a third width w3 of the third elongated mask opening 108$_3$. Apart from the first to third elongated mask openings 108$_1$, 108$_2$, 108$_3$ illustrated in FIG. 1A, additional mask openings having widths equal to or different from the widths illustrated in FIG. 1A. may be present in other parts of the process surface 104 not illustrated in FIG. 1A and constituting another part of the plurality of elongated mask openings. The elongated mask openings may be striped-shaped as illustrated in FIG. 1A or may also include bend or curved portions provided that the elongated mask openings as a whole extend along the first direction y.

Figure 1B:
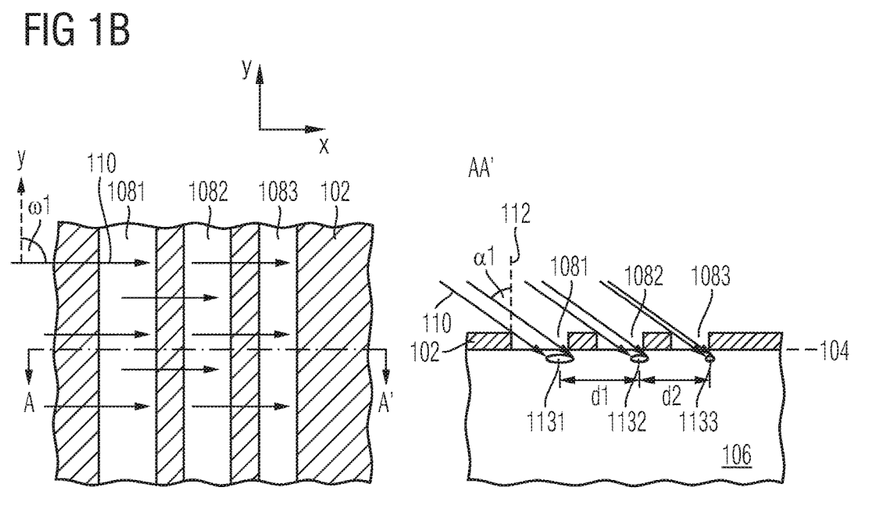
FIG. 1B are schematic top and cross sectional views of the semiconductor layer of FIG. 1A after implanting first dopants through the elongated mask openings based on a first tilt angle $\alpha 1$ and a first twist angle $\omega 1$.

Referring to the schematic top and cross sectional views of FIG. 1B, first dopants of a first conductivity type are implanted into the semiconductor layer 106 based on a first tilt angle α1 between an ion beam direction 110 and a process surface normal 112 and based on a first twist angle ω1 between the first lateral direction y and a projection of the ion beam direction. 110 on the process surface 104. Examples of the first dopants for semiconductor layers made of or including silicon are boron. (B), aluminum (Al), gallium (Ga) for p-type doping and phosphorus (P), arsenic (As), antimony (Sb) for n-type doping. In some embodiments, the first tilt angle α1 is set in a range from 20° to 80°. In some embodiments, the first twist angle ω1 is set in a range from 80° to 100°. The implantation of the first dopants through the first to third elongated mask openings 1081, 1082, 1083 results in first to third implant regions of the first conductivity type 1131, 1132, 1133. Due to the different widths of the first to third elongated mask openings 1081, 1082, 1083, different amounts of the first dopants may be implanted through the first to third elongated mask openings 1081, 1082, 1083. By way of example, assuming that a width of a mask portion between neighboring elongated mask openings is constant, a first center to center distance dl between the first and second implant regions of the first conductivity type 1131, 1132 is larger than a second center to center distance d2 between the second and third implant regions of the first conductivity type 1132, 1133.

Figure 1C:
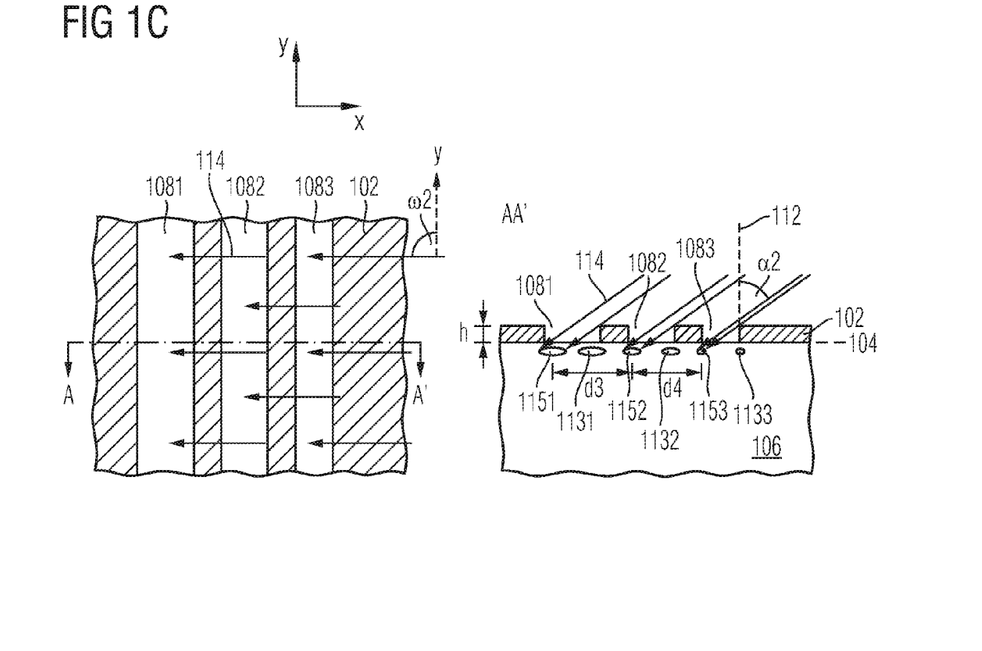
FIG. 1C are schematic top and cross sectional views of the semiconductor layer of FIG. 1B after implanting second dopants through the elongated mask openings based on a second tilt angle $\alpha 2$ and a second twist angle $\omega 1$.

Referring to the schematic top and cross sectional views of FIG. 1C, second dopants of a second conductivity type are implanted into the semiconductor layer 106 based on a second tilt angle α2 between an ion beam direction 114 and a process surface normal 112 and based on a second twist angle ω2 between the first lateral direction y and a projection of the ion beam direction 114 on the process surface 104. The first conductivity type and the second conductivity type are different. The first conductivity type may be an n-type and the second conductivity type may be a p-type or vice versa. Examples of the second dopants for semiconductor layers made of or including silicon are boron (B), aluminum (Al), gallium (Ga) for p-type doping and phosphorus (B), arsenic (As), antimony (Sb) for n-type doping. In some embodiments, the second tilt angle α2 is set in a range from +20° to +80°. In some embodiments, the second twist angle ω2 is set in a range from −80° to −100°. The implantation of the second dopants through the first to third elongated mask openings 1081, 1082, 1083 results in first to third implant regions of the second conductivity type 1151, 1152, 1153. Due to the different widths of the first to third elongated mask openings 1081, 1082, 1083, and assuming that a width of a mask portion between neighboring elongated mask openings is constant, a third center to center distance d3 between the first and second implant regions of the second conductivity type 1151, 1152 is larger than a fourth center to center distance d4 between the second and third implant regions of the second conductivity type 1152, 1153.

In some embodiments, the second tilt angle α2 is set to +α1. In some embodiments, the second twist angle ω2 is set to −ω1.

In some embodiments, a thickness h of the mask 102 is set in a range from 0.1×w/tan (α1) to 0.9×w/tan(α1) or in a range from 0.1×w/tan(α2) to 0.9×w/tan(α2), w being the width of one of the elongated mask openings, for example w1, w2, or w3.

Figure 1D:
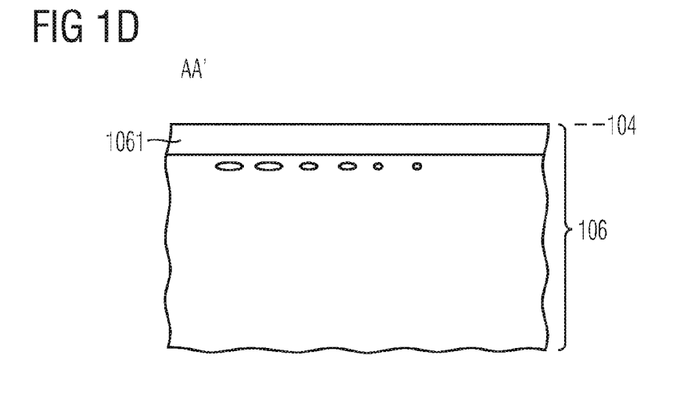
FIG. 1D is a schematic cross sectional view of the semiconductor layer of FIG. 1C after increasing a thickness of the semiconductor layer by forming an epitaxial layer.

Referring to the schematic cross sectional view of FIG. 1D, a thickness of the semiconductor layer 106 is increased by forming an epitaxial layer 1061. The epitaxial layer 1061 may be formed by an epitaxial layer growth process, for example by chemical vapor deposition (CVD). In some embodiments, a thickness of the epitaxial layer 1061 is set in a range 1 μm to 15 μm, for example in a range from 2 μm to 8 μm.

Figure 1E:
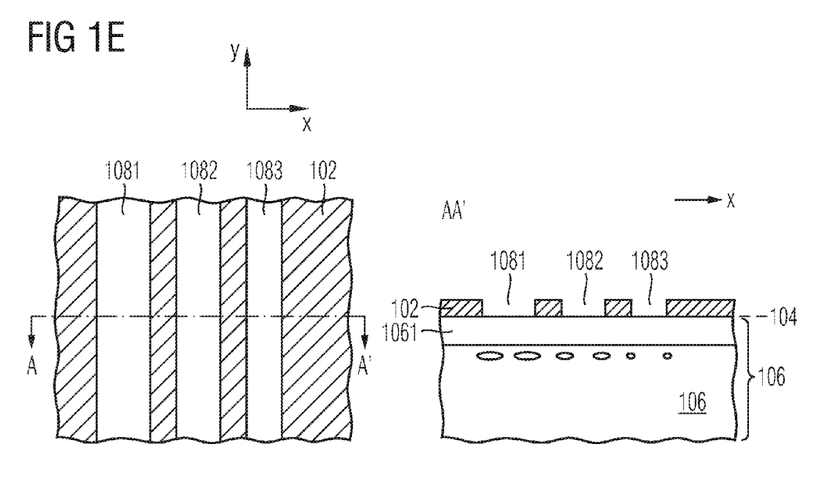
FIG. 1E are schematic top and cross sectional views of the semiconductor layer of FIG. 1D after repeating forming a mask comprising elongated mask openings on a process surface as illustrated in FIG. 1A.

Referring to the schematic cross sectional view of FIG. 1E, the process as illustrated and described with respect to FIG. 1A is repeated. In some embodiments, the process as illustrated and described with respect to FIG. 1A is repeated based on same process parameters, for example based on a same thickness h of the mask 102 and/or same widths of the elongated mask openings. In some other embodiments, the process as illustrated and described with respect to FIG. 1A is repeated based on one or more different process parameters, for example based on a different thickness h of the mask 102 and/or different widths of the elongated mask openings.

Figure 1F:
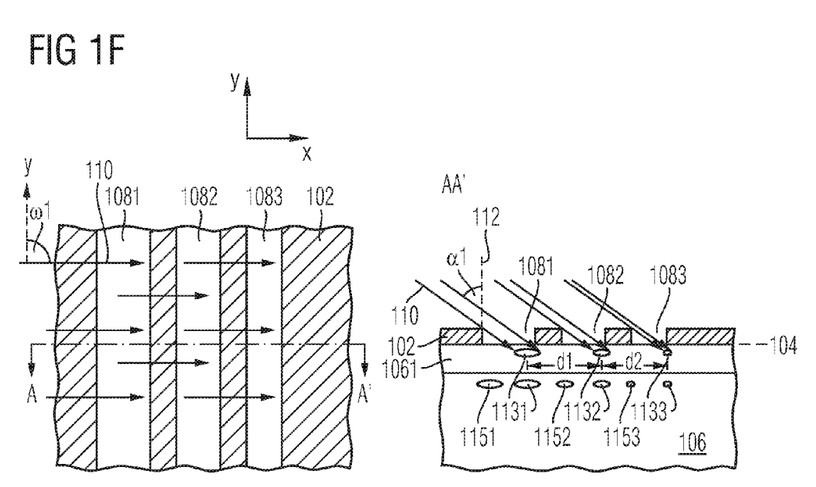
FIG. 1F are schematic top and cross sectional views of the semiconductor layer of FIG. 1F after repeating implanting first dopants through the elongated mask openings based on a first tilt angle $\alpha 1$ and a first twist angle $\omega 1$ as illustrated in FIG. 1B.

Referring to the schematic cross sectional view of FIG. 1F, the process as illustrated and described with respect to FIG. 1B is repeated. Similar to above, one or more process parameters, for example the first tilt angle α1 and/or the first twist angle ω1 may differ from parameter values used before in FIG. 1B or thereafter in a subsequent repetition.

Figure 1G:
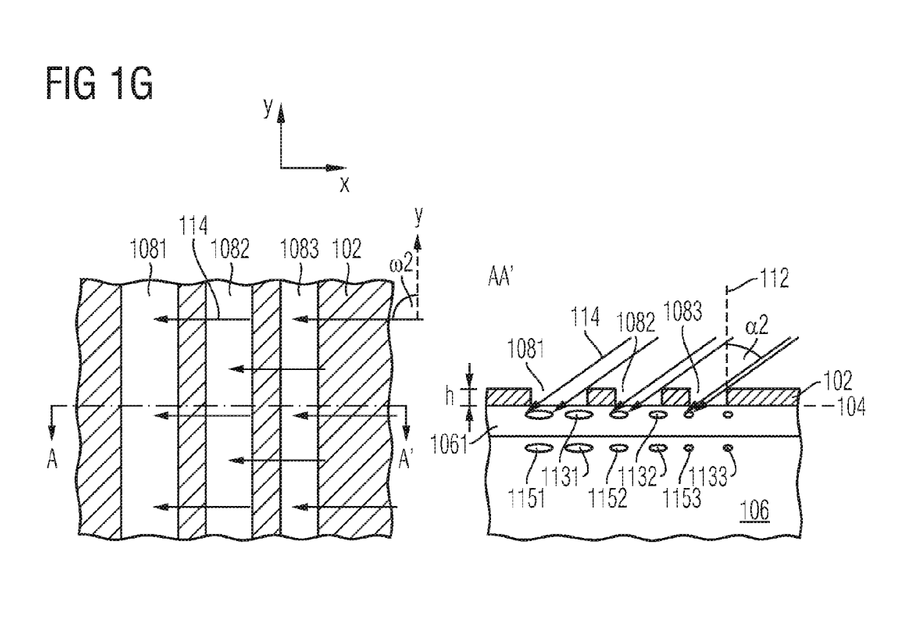
FIG. 1G are schematic top and cross sectional views of the semiconductor layer of FIG. 1F alter repeating implanting second dopants through the elongated mask openings based on a second tilt angle $\alpha 2$ and a second twist angle $\omega 2$ as illustrated in FIG. 1C.

Referring to the schematic cross sectional view of FIG. 1G, the process as illustrated and described with respect to FIG. 1C is repeated. Similar to above, one or more process parameters, for example the second tilt angle α2 and/or the second twist angle ω2 may differ from parameter values used before in FIG. 1C or thereafter in a subsequent repetition.

Further repetitions of the processes illustrated in FIGS. 1D to 1G may follow for adapting a vertical extension of the super junction structure in conjunction with implantation doses of the first and second dopants to a desired drain to source blocking voltage of the final device. Examples of drain to source blocking voltage or device voltage classes include blocking voltages in the range of hundreds of volts, for example 400V, 500V, 600V, 650V, 700V, 800V, 900V, 1000V.

In some embodiments, the width of the elongated mask openings of the at least some of the plurality of the elongated mask openings decreases along a second lateral direction from a transistor cell area to an edge termination area. Referring to the schematic top and cross-sectional views of FIGS. 1A to 1G, the second lateral direction x may be directed from the transistor cell area to the junction termination area and the first to third implant regions of the first conductivity type 1131, 1132, 1133 and the first to third implant regions of the second conductivity type 1151, 1152, 1153 may be arranged in the edge termination area, for example.

The embodiment described with reference to FIGS. 1A to 1G is beneficial in several regards. When using a single mask for implanting p- and n-type dopants instead of different masks for implanting n- and p-type dopants, a charge imbalance caused by process fluctuations in a width of implant mask openings of the different masks can be avoided. Furthermore, when decreasing a width of the mask openings at a transition region between the transistor cell area and the edge termination area, a dose of the implant regions decreases with decreasing width of the mask opening due to shadowing effects of the implant beam by the mask. Thereby, a charge imbalance caused by an outermost of the p- and n-doped regions can be decreased resulting in a lower charge imbalance in that region. Tilted implants through mask openings allow for manufacturing regions of small lateral dimensions compared with the lateral dimension of the mask openings.

Figure 2:
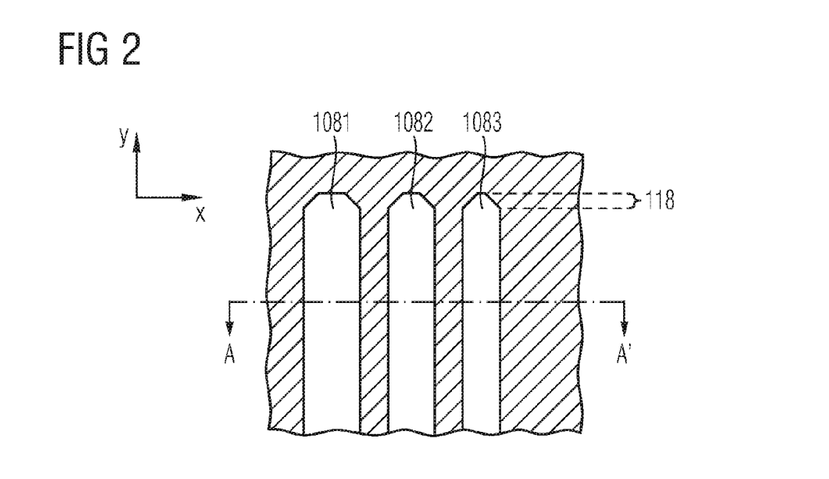
FIG. 2 is a schematic top view of the elongated mask openings, wherein a width of the elongated mask openings decreases along a lateral direction in an end portion.

Referring to the schematic top view of FIG. 2, a width of the first to third elongated mask openings 1081, 1082, 1083 decreases along the first lateral direction y in an end portion 118, for example stepwise and/or continuous. The end portion may extend into an edge termination area including trench segments having a smaller width than in a cell area.

FIGS. 3A to 3H are schematic top and cross sectional views of a semiconductor body for illustrating another embodiment of a method of manufacturing a super junction semiconductor device.

It will be appreciated that while method is illustrated and described below as a series of acts or events, the illustrated ordering of such acts or events are not to be interpreted in a limiting sense. For example, some acts may occur in different orders and/or concurrently with other acts or events apart from those illustrated and/or described herein. In addition, not all illustrated acts may be required to implement one or more aspects of embodiments of the disclosure herein. Also, one or more of the acts depicted herein may be carried out in one or more separate act and/or phases.

Figure 3A:
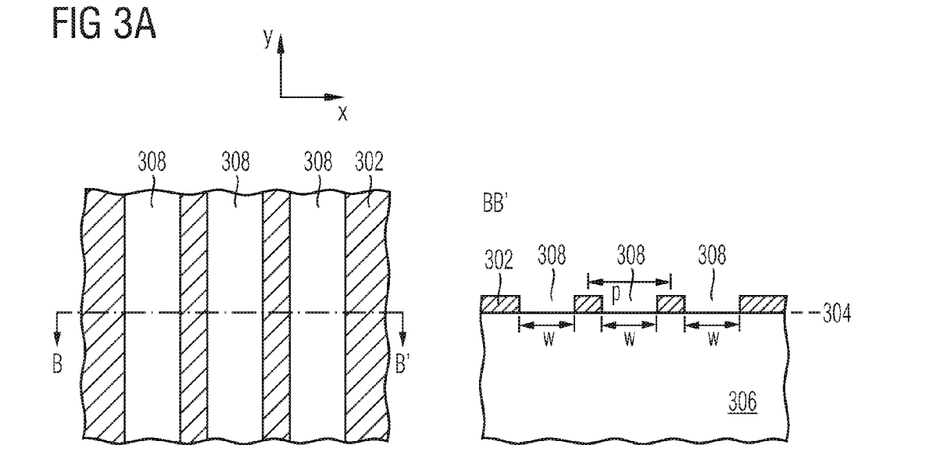
FIG. 3A are schematic top and cross sectional views of a semiconductor layer after forming a mask comprising elongated mask openings on a process surface.

Referring to the schematic top and cross sectional views of FIG. 3A, a mask 302 is formed on a process surface 304 of a semiconductor layer 306. The mask 302 includes elongated mask openings 308 exposing a part of the semiconductor layer 306. The elongated mask openings 308 extend along the first lateral direction y. The elongated mask openings may have a same width w. Apart from the elongated mask openings 308 illustrated in FIG. 3A, additional mask openings having may be present in other parts of the process surface 304 not illustrated FIG. 3A. The elongated mask openings 308 may be stripe-shaped as illustrated in FIG. 3A or may also include bend or curved. portions provided that the elongated mask openings 308 as a whole extend along the first direction y. The elongated mask openings may be arranged in a transistor cell area. A pitch p between the elongated mask openings may correspond to a pitch of the transistor cells to be manufactured in the semiconductor layer 306.

Figure 3B:
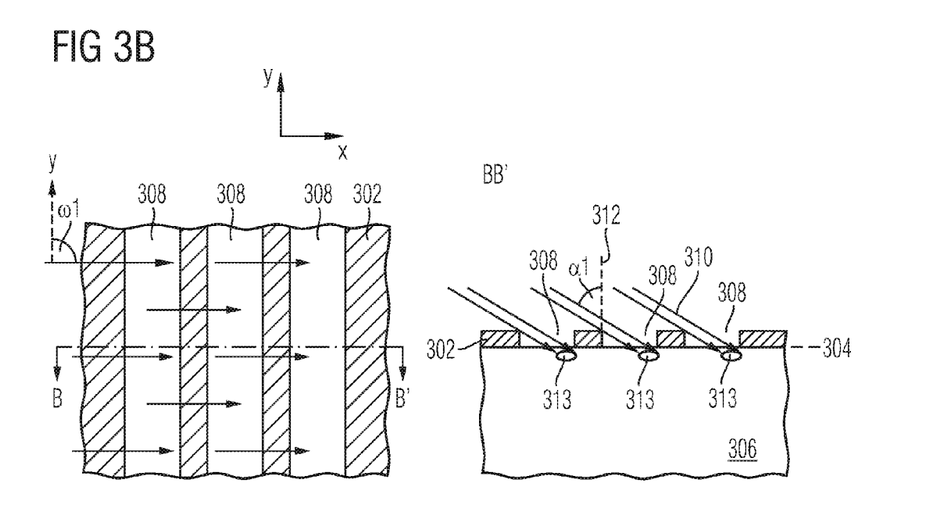
FIG. 3B are schematic top and cross sectional views of the semiconductor layer of FIG. 3A after implanting first dopants through the elongated mask openings based on a first tilt angle $\alpha 1$ and a first twist angle $\omega 1$.

Referring to the schematic top and cross sectional views of FIG. 3B, first dopants of a first conductivity type are implanted into the semiconductor layer 306 based on the first tilt angle $\alpha 1$ between an ion beam direction 310 and a process surface normal 312 and based on the first twist angle $\omega 1$ between the first lateral direction y and a projection of the ion beam direction 310 on the process surface 304. Examples of the first dopants for semiconductor layers made of or including silicon. are boron (B), aluminum (Al), gallium (Ga) for p-type doping and phosphorus (P), arsenic (As), antimony (Sb) for n-type doping. In some embodiments, the first tilt angle $\alpha 1$ is set in a range from 20° to 80°, or in a range from 30' to 70°. In some embodiments, the first twist angle $\omega 1$ is set in a range from 80° to 100°. The implantation of the first dopants through the elongated mask openings 308 results in implant regions 313 of the first conductivity type.

Figure 3C:
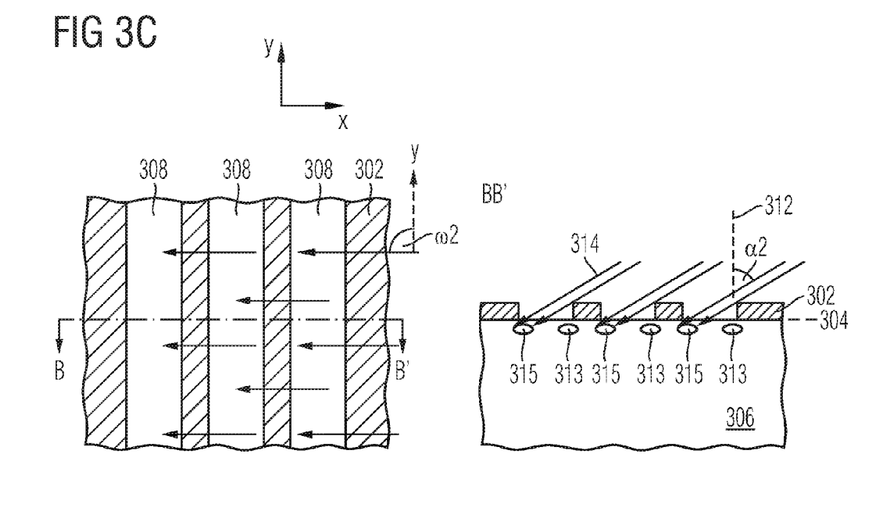
FIG. 3C are schematic top and cross sectional views of the semiconductor layer of FIG. 3B after implanting second dopants through the elongated mask openings based on a second tilt angle $\alpha 2$ and a second twist angle $\omega 1$.

Referring to the schematic top and cross sectional views of FIG. 3G, second dopants of a second conductivity type are implanted into the semiconductor layer 306 based on the second tilt angle $\alpha 2$ between an ion beam direction 314 and a process surface normal 312 and based on the second twist angle $\omega 2$ between. the first lateral direction y and a projection of the ion beam direction 314 on the process surface 304. The first conductivity type and the second conductivity type are different. The first conductivity type may be an n-type and the second conductivity type may be a p-type or vice versa. Examples of the second dopants for semiconductor layers made of or including silicon are boron (B), aluminum (Al), gallium (Ga) for p-type doping and phosphorus (B), arsenic (As), antimony (Sb) for n-type doping. In some embodiments, the second tilt angle $\alpha 2$ is set in a range from +20' to +80°. In some embodiments, the second twist angle $\omega 2$ is set in a range from −80° to −100°. The implantation of the second dopants through the elongated mask openings 3081 results in implant regions 315 of the second conductivity type.

In some embodiments, the second tilt angle $\alpha 2$ is set to $+\alpha 1$.

In some embodiments, the second twist angle $\omega 2$ is set to $-\omega 1$.

In some embodiments, a thickness h of the mask 102 is set in a range from $0.1 \times w/\tan(\alpha 1)$ to $0.9 \times w/\tan(\alpha 1)$ or in a range from $0.1 \times w/\tan(\alpha 2)$ to $0.9 \times w/\tan(\alpha 2)$, w being the width of one of the elongated mask openings.

Figure 3D:
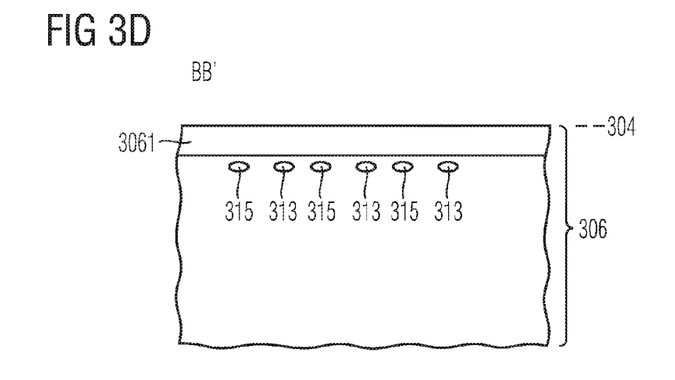
FIG. 3D is a schematic cross sectional view of the semiconductor layer of FIG. 3C after increasing a thickness of the semiconductor layer by forming an epitaxial layer.

Referring to the schematic cross sectional view of FIG. 3D, a thickness of the semiconductor layer 306 is increased by forming an epitaxial layer 3061. The epitaxial layer 3061, may be formed by an epitaxial layer growth process, for example chemical vapor deposition (CVD). In some embodiments, a thickness of the epitaxial layer 3061 is set in a range 1 µm to 15 µm, for example in a range from 2 µm to 8 µm.

After carrying out the processes illustrated and described with reference to FIGS. 3A to 3D, the processes illustrated with respect to FIGS. 3A to 3C are repeated at least one time, wherein the elongated mask openings are staggered to the elongated mask openings previously formed in FIG. 3A along a second lateral direction by an offset o, and twist angles of FIGS. 1B and 1C are interchanged. In other words, instead of implanting the first dopants based on the first twist angle $\omega 1$ as illustrated in FIG. 1B, the first dopants are implanted based on the second twist angle $\omega 2$. Likewise, instead of implanting the second dopants based on the second twist angle $\omega 2$ as illustrated in FIG. 1C, the second dopants are implanted based on the first twist angle $\omega 1$. This will be illustrated with reference to FIGS. 3E to 3G below.

Figure 3E:
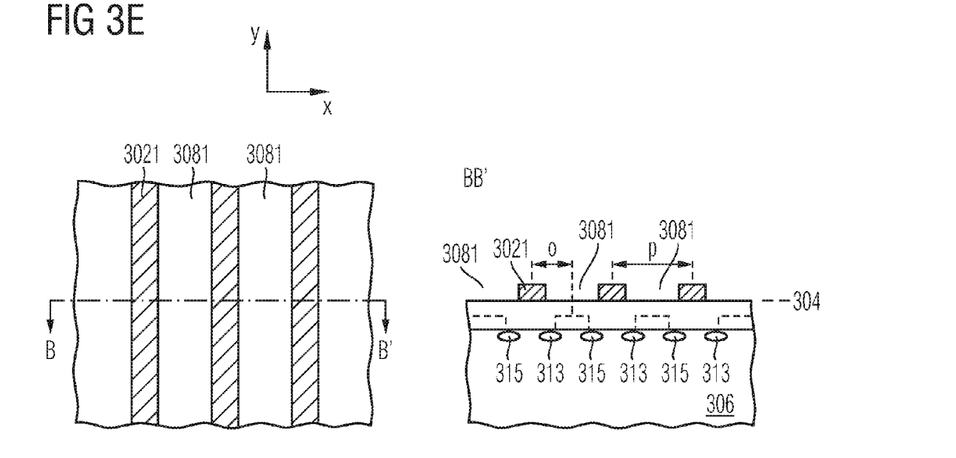
FIG. 3E are schematic top and cross sectional views of the semiconductor layer of FIG. 3D after repeating forming a mask comprising elongated mask openings on a process surface as illustrated in FIG. 3A, wherein the mask is laterally staggered to the mask formed in FIG. 3A by an offset.

Referring to the schematic top and cross sectional views of FIG. 3E, a mask 3021 is formed on the process surface 304 of the semiconductor layer 306. The mask 3021 includes elongated mask openings 3081 exposing a part of the semiconductor layer 306. The elongated mask openings 3081 are staggered to the elongated mask openings 308 previously formed in FIG. 3A along the second lateral direction x by an offset o. The elongated mask openings 308 previously formed in FIG. 3A are depicted in FIG. 3E by a dashed line for illustration purposes. In some embodiments, the offset o is smaller or equal to half of the pitch p between neighboring mask openings 3081 in a transistor cell area.

Figure 3F:
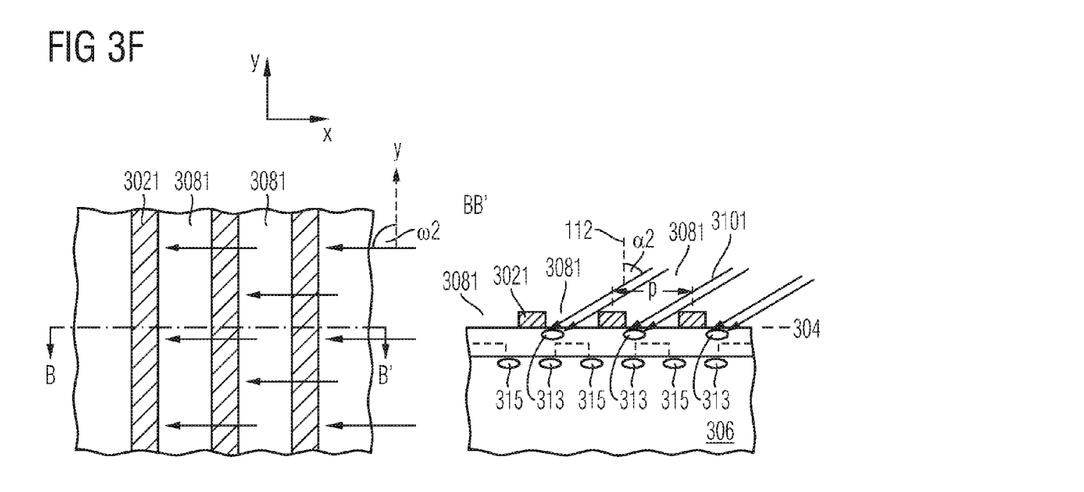
FIG. 3F are schematic top and cross sectional views of the semiconductor layer of FIG. 3E after repeating implanting first dopants through the elongated mask openings based on the second tilt angle $\alpha 2$ and the second twist angle $\omega 2$ also used for implanting the second dopants as illustrated in FIG. 3C.

Referring to the schematic top and cross sectional views of FIG. 3F, first dopants of the first conductivity type are implanted into the semiconductor layer 306 based on the second tilt angle $\alpha 2$ between an ion beam direction 3101 and the process surface normal 312 and based on the second twist angle $\omega 2$ between the first lateral direction y and a projection of an ion beam direction 3101 on the process surface 304. The implantation of the first dopants through the elongated mask openings 3081 results in implant regions 313 of the first conductivity type.

Figure 3G:
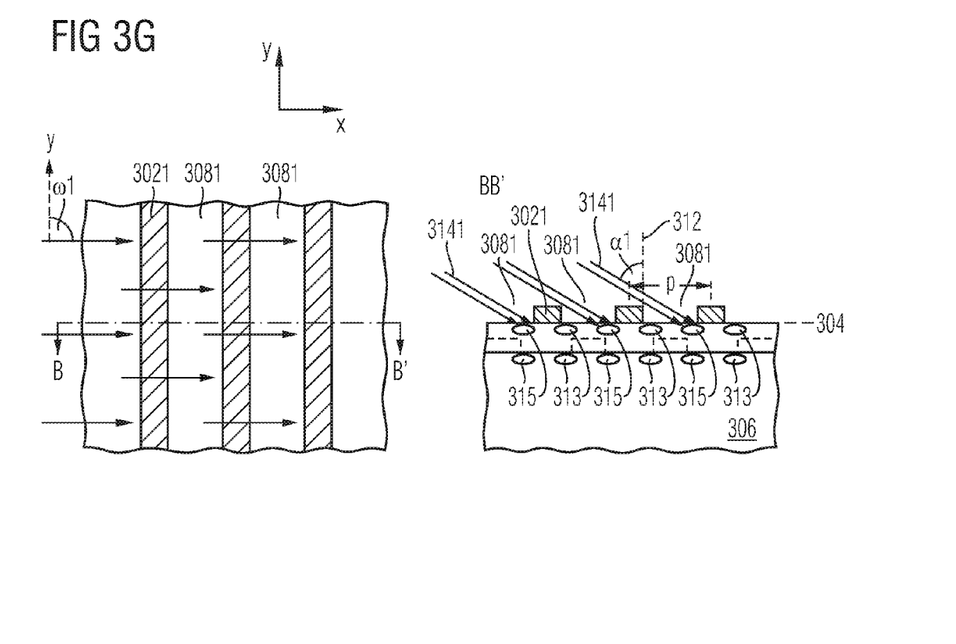
FIG. 3G are schematic top and cross sectional views of the semiconductor layer of FIG. 3F after repeating implanting second dopants through the elongated mask openings based on the first tilt angle $\alpha 1$ and the first twist angle $\omega 1$ also used for implanting the first dopants as illustrated in FIG. 3B.

Referring to the schematic top and cross sectional views of FIG. 3G, second dopants of the second conductivity type are implanted into the semiconductor layer 306 based on the first tilt angle $\alpha 1$ between an ion beam direction 314 and a process surface normal 312 and based on the first twist angle $\omega 1$ between. the first lateral direction y and a projection of an ion beam direction 3141 on the process surface 304. The implantation of the second dopants through the elongated mask openings 3081 results in implant regions 315 of the second conductivity type.

The process illustrated in FIG. 3D followed by the processes illustrated in FIGS. 3A to 3D on the one side and the processes illustrated in FIGS. 3D to 3G on the other side may be alternately repeated for adapting a vertical extension of the super junction structure in conjunction with implantation doses of the first and second dopants to a desired drain to source blocking voltage of the final device. Examples of drain to source blocking voltage or device voltage classes include blocking voltages in the range of hundreds of volts, for example 400V, 500V, 600V, 650V, 7007, 800V, 900V, 1000V.

Figure 3H:
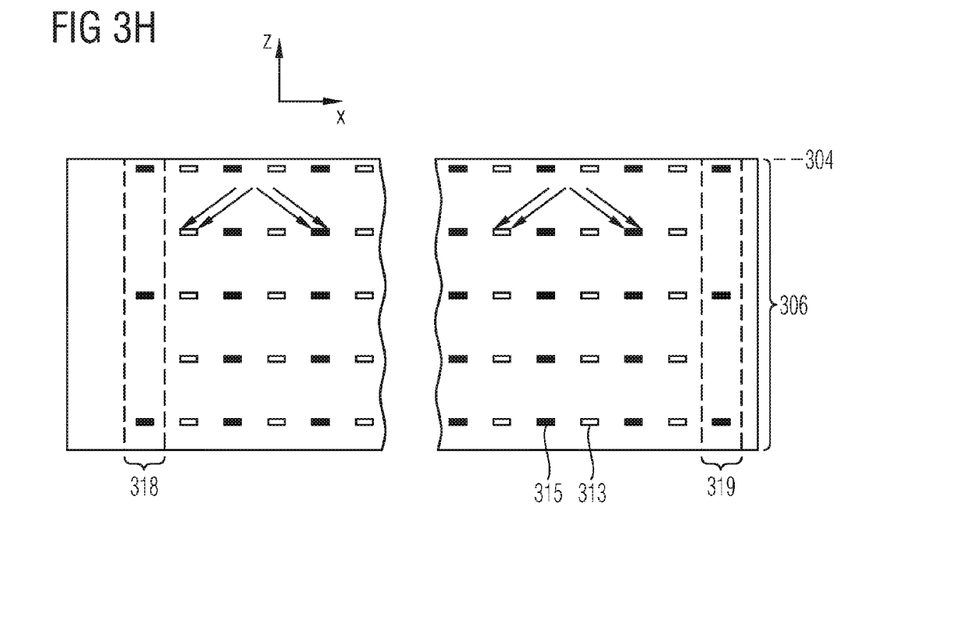
FIG. 3H is a schematic top view of the semiconductor layer of FIG. 3G after repeating process features as illustrated with respect to FIGS. 3A to 3G.

An embodiment illustrating the implant regions 313, 315 at opposite ends of a transistor junction termination area is illustrated in FIG. 3H. Due to the offset o of the mask and reverse of implant twist angles between implants of successive epitaxial levels, a charge imbalance caused by an outermost of the p- and n-doped regions can be decreased by omitting every second implant region along the vertical direction in outermost regions 318, 319 of dopant implantation.

Figure 4:
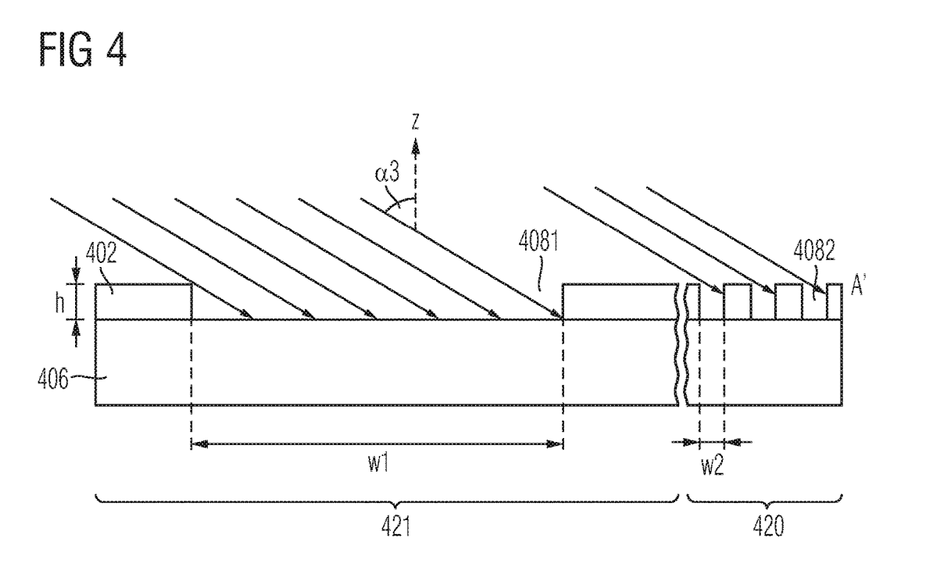
FIG. 4 is a schematic cross sectional view of the semiconductor layer for illustrating a process of implanting further dopants based on a third tilt angle $\alpha 3$, wherein an absolute value of the third tilt angle $\alpha 3$ is set larger than an absolute value of the first tilt angle $\alpha 1$.

Referring to the schematic cross-sectional view of FIG. 4, the methods described above with reference to FIGS. 1A to 3H, comprise, in addition to implanting dopants of the first conductivity type into the semiconductor layer based on the first tilt angle $\alpha 1$ as illustrated in FIGS. 1B, 1F, 3B, implanting further dopants of the first conductivity type based on a third tilt angle $\alpha 3$, wherein an absolute value of the third tilt angle $\alpha 3$ is set larger than an absolute value of the first tilt angle $\alpha 1$, i.e. $\alpha 3 > \alpha 1$.

in some embodiments, the plurality of elongated mask openings include a first elongated mask opening 4081 outside a transistor cell area 420 of a semiconductor layer 406, for example in an edge termination area, and a second elongated mask opening 4082 inside the transistor cell area 420. A width w1 of the first elongated mask opening 4081 is set larger than a width w2 of the second elongated mask opening 4082. The widths w1, w2 are measured along a projection of the ion beam direction on the process surface.

In some embodiments, a thickness h of a mask 402 comprising the first and second elongated mask openings 4081, 4082 is set larger than w2/tan($\alpha 3$). Thereby, the dopants of the first conductivity type are hindered from entering the semiconductor layer 406 through the second elongated. mask opening 4082 due to shadowing effects by the mask 402.

Although the implants of the first and second dopants as illustrated e.g. in FIGS. 1B, 1C will also enter the semiconductor layer 406 through the first elongated mask opening 4081, these implants may largely cancel each other with respect to a net doping, and hence, the third dopants introduced through the first elongated mask opening 4081 may define a net doping of a semiconductor region such as a field stop region arranged outside the transistor cell area 420 without requiring an addition photomask. Implant doses of the third dopants may be greater than the implant doses for each of the first and second dopants, for example.

Further processes may follow for finalizing the super junction semiconductor device. Examples of further processes include formation of gate dielectric, gate electrode, load terminals at opposite surfaces of the semiconductor body and wiring areas, thermal processing for vertical inter-diffusion of dopants of the implant regions.

Figure 5:
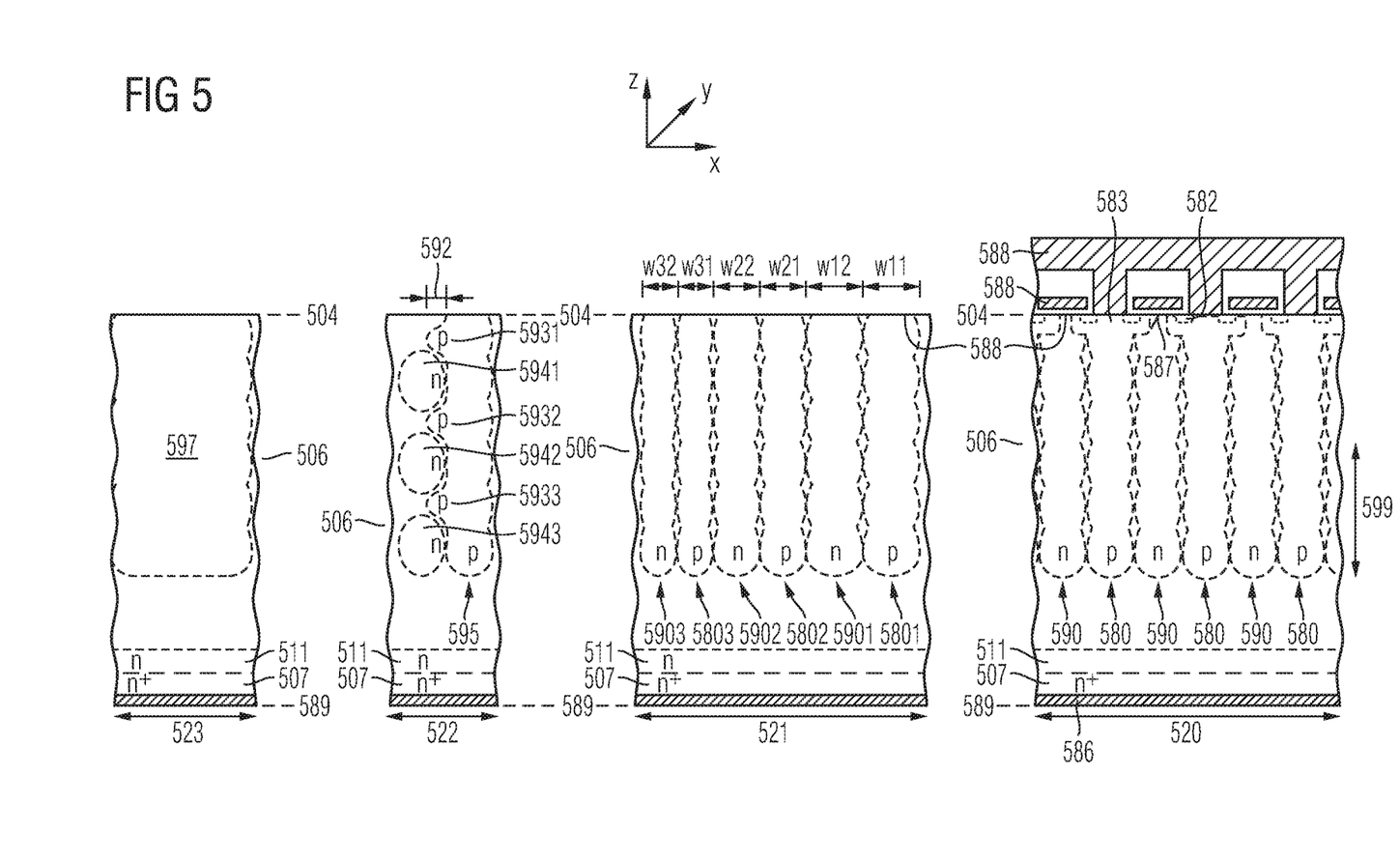
FIG. 5 illustrate schematic cross sectional views of the semiconductor layer after carrying out manufacturing processes illustrated with respect to FIGS. 1A to 4.

FIG. 5 illustrates one embodiment of a cross-sectional view of a semiconductor device manufactured as described with reference to the embodiments above.

In the embodiment illustrated in FIG. 5, a semiconductor body comprising a semiconductor layer 506 on a highly doped semiconductor substrate 507 includes a vertical super junction (SJ) n-channel field-effect transistor (NFET).

A super junction structure of the SJ NFET includes p- and n-doped regions 580, 590 in a transistor cell area 520 which are formed by vertical inter-diffusion of dopants of the implant regions 1131, 1132, 1133, 1151, 1152, 1153 of FIG. 1G, respectively, or by vertical inter-diffusion of dopants of the implant regions 313, 315 of FIG. 3G or 3H, respectively.

An optional pedestal layer is arranged between the super junction structure and the highly doped semiconductor substrate 507.

The highly doped semiconductor substrate 507 constitutes a drain region. Each one of the p-doped regions 580, 590 adjoins a bottom side of a p-doped body region. 583. The p-doped body region 583 is electrically coupled to a source contact 588 at a first surface 504 of the semiconductor layer 506. $n^+$-doped source regions 582 adjoin the first surface 504 and are electrically coupled to the source contact 588. A planar gate structure including a gate dielectric 584 and a gate electrode 585 is arranged on the semiconductor layer 506 at the first surface 504 and is configured to control a conductivity in a channel region 587 by field effect. Thereby, a current flow between the source contact 588 at the first surface 504 and a drain contact 586 at a second surface 589 of the semiconductor body can be controlled. The source and drain contacts 588, 586 may include conductive materials such as metal(s) and/or highly doped semiconductor material(s).

The vertical SJ NFET illustrated in FIG. 5 is one example of a semiconductor device including the super junction structure as described above. Other embodiments may include vertical SJ n- or p-channel FETs, lateral SJ FETs including source and drain contacts at a common, lateral or vertical insulated gate bipolar transistors (IGBTs), for example.

The manufacturing processes illustrated in FIG. 1A to 1G may result in a part of the super junction structure as illustrated in device area 521 in FIG. 5. The device area 521 may be part of an edge termination area, for example.

A width of n-doped regions 5901, 5902, 5903, which originate from vertical inter-diffusion of dopants of the implant regions of the second. conductivity type 1151, 1152, 1153 of FIG. 1G, respectively, successively decreases from one of the n-doped regions in the device area 521 to another one of the n-doped. regions in the device area 521 along a lateral direction –x. A. width of p-doped regions 5801, 5802, 5803, which originate from vertical inter-diffusion of dopants of the implant regions 1131, 1132, 1133 of FIG. 1G, respectively, successively decreases from one of the p-doped regions in the device area 521 to another one of the p-doped regions in the device area 521 along a second direction –x. In some other embodiments, the width may decrease stepwise having one or more than one region of equal width before a further reduction of width occurs.

In the illustrated portion of the semiconductor layer 506 in the device area 521, a first width w12 of the n-doped region 5901 is larger than a second width w22 of the n-doped region 5902. The second width w22 of the n-doped region 5902 is larger than a third width w32 of the n-doped region 5903. Likewise, a first width w11 of the p-doped region 5801 larger than a second width w21 of the p-doped region 5802. The second width w21 of the p-doped region 5802 is larger than a third. width w31 of the p-doped region 5803. In some embodiments, for example when using p- and n-type dopants having similar diffusion characteristics and/or manufacturing the p- and n-implant regions based on similar absolute implant tilt angles, the first widths w11, w12 may be equal, the second widths w21, w22 may be equal, and the third widths w31, w32 may be equal. In some other embodiments, for example when using p- and n-type dopants having different diffusion characteristics and/or manufacturing the implant regions based on similar absolute implant tilt angles, the first widths w11, w12 may be different, the second widths w21, w22 may be different, and the third widths w31, w32 may be different.

The manufacturing processes illustrated in FIGS. 3A to 3H may result in a part of the super junction structure as illustrated in device area 522 in FIG. 5. The device area 522 may be part of an edge termination area, for example.

In the illustrated portion of the semiconductor layer 506 in the device area 522, in a first semiconductor area 592 adjoining an outermost region 595 of the n- and p-doped regions along the second direction x, a plurality of first n- and p-doped sub-regions 5931, 5932, 5933, 5941, 5942, 5943 are alternately arranged along an extension of the outermost region 595 of the n- and p-doped regions 580, 590 in a vertical direction perpendicular to a plane spanned by lateral directions y and x. By varying process parameters from sub-layer to sub-layer, a contour of the p-doped sub-regions may also be curved or tilted to a surface normal, for example.

The manufacturing processes illustrated in FIG. 4 may result in a field stop region 597 in a device area 523 of the semiconductor layer 506 as illustrated in FIG. 5. The field stop region 597 is of a conductivity type equal to the conductivity type of a drift zone or of the n$^+$-doped source regions 582 or of the highly doped semiconductor substrate 507. In the embodiment illustrated in FIG. 5, the field stop region 597 is n-doped. In other embodiments that are based on p-doped drift zones, the field stop region 597 may also be p-doped.

A dose of p-dopants in the n-doped field stop region 597 equals a dose of p-dopants of one of the p-doped regions 580 measured along a vertical extension 599 between a vertical center and a bottom side of the one of the p-doped regions 580. This is caused by the p-type dopant implants based on the tilt angle $\alpha1$ or $\alpha2$ as described in the embodiments above.

Structures illustrated in the device areas 521, 522, 523 may be combined in a semiconductor device. Also some or one of the structures illustrated in the device areas 521, 522, 523 may be present in the semiconductor device.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A method of manufacturing a semiconductor device in a semiconductor body, the method comprising:
   i) forming a mask on a process surface of a semiconductor layer, the mask comprising a plurality of elongated mask openings exposing a part of the semiconductor layer, the plurality of elongated mask openings extending along a first lateral direction, wherein at least some of the plurality of elongated mask openings differ in a width;
   ii) implanting first dopants of a first conductivity type into the semiconductor layer based on a first tilt angle $\alpha1$ between an ion beam direction and a process surface normal and based on a first twist angle $\omega1$ between the first lateral direction and a projection of the ion beam direction on the process surface;
   iii) implanting second dopants of a second conductivity type into the semiconductor layer based on a second tilt angle $\alpha2$ between an ion beam direction and the process surface normal and based on a second twist angle $\omega2$ between the first lateral direction and a projection of the ion beam direction on the process surface;
   iv) increasing a thickness of the semiconductor layer by forming an epitaxial layer;
   v) repeating i) to iii) at least one time.

2. The method of claim 1, wherein the width of the elongated mask openings of the at least some of the plurality of the elongated mask openings decreases along a second lateral direction from a transistor cell area to a junction termination area.

3. The method of claim 1, wherein the first tilt angle $\alpha1$ is set in a range from 20° to 80° and the second tilt angle $\alpha2$ is set in a range from 20° to 80°.

4. The method of claim 3, wherein the second tilt angle $\alpha2$ is set to $\alpha1$.

5. The method of claim 1, wherein the first twist angle $\omega1$ is set in a range from 80° to 100° and the second twist angle $\omega2$ is set in a range from −80° to −100°.

6. The method of claim 5, wherein the second twist angle $\omega2$ is set to $-\omega1$.

7. The method of claim 1, wherein a thickness h of the mask is set in a range from $0.1 \times N/\tan(\alpha1)$ to $0.9 \times w/\tan(\alpha1)$.

8. The method of claim 1, wherein the width of at least some of the plurality of elongated mask openings decreases along the first lateral direction in an end portion.

9. The method of claim 1, wherein the elongated mask openings are stripe-shaped.

10. The method of claim 1, further comprising forming source, body, and contact regions at a first surface of the semiconductor body; and
   forming drain, and contact regions at a second surface of the semiconductor body opposite to the first surface.

11. A method of manufacturing a semiconductor device in a semiconductor body, the method comprising:
   i) forming a mask on a process surface of a semiconductor layer, the mask comprising a plurality of elongated mask openings exposing a part of the semiconductor layer, the plurality of elongated mask openings extending along a first lateral direction;
   implanting dopants of a first conductivity type into the semiconductor layer based on a first tilt angle $\alpha1$ between an ion beam direction and a process surface normal and based on a first twist angle $\omega1$ between the first lateral direction and a projection of the ion beam direction on the process surface;
   iii) implanting dopants of a second conductivity type into the semiconductor layer based on a second tilt angle $\alpha2$ between an ion beam direction and the process surface normal and based on a second twist angle $\omega2$ between the first lateral direction and a projection of the ion beam direction on the process surface;
   iv) increasing a thickness of the semiconductor layer by forming an epitaxial layer;
   v) repeating i) to iv) at least one time, wherein the elongated mask openings are staggered to the elongated mask openings previously formed in process i) along a second lateral direction by an offset, and the tilt and twist angles of ii) and iii) are interchanged.

12. The method of claim 11, wherein the offset is smaller or equal to half of a pitch between neighboring mask openings in a transistor cell area.

13. The method of claim 11, wherein a same lithography mask is used for processes i) and v).

14. The method of claim 11, further comprising:
   repeating i) to v) at least one time.

15. A method of manufacturing a semiconductor device in a semiconductor body, the method comprising:
  i) forming a mask on a process surface of a semiconductor layer, the mask comprising a plurality of elongated mask openings exposing a part of the semiconductor layer, the plurality of elongated mask openings extending along a first lateral direction, and wherein at least some of the plurality of elongated mask openings differ in a width;
  implanting first dopants of a first conductivity type into the semiconductor layer based on a first tilt angle α1 between an ion beam direction and a process surface normal and based on a first twist angle ω1 between the first lateral direction and a projection of the ion beam direction on the process surface;
  iii) implanting second dopants of a second conductivity type into the semiconductor layer based on a second tilt angle α2 between an ion beam direction and the process surface normal and based on a second twist angle ω2 between the first lateral direction and a projection of the ion beam direction on the process surface;
  iv) increasing a thickness of the semiconductor layer by forming an epitaxial layer;
  v) repeating i) to iii) at least one time, wherein
  process ii) includes, in addition to implanting dopants of a first conductivity type into the semiconductor layer based on a first tilt angle α1, implanting further dopants of the first conductivity type based on a third tilt angle α3, wherein an absolute value of the third tilt angle α3 is set larger than an absolute value of the first tilt angle α1.

16. The method of any claim 15, wherein the plurality of elongated mask openings include a first elongated mask opening outside a transistor cell area and a second elongated mask opening inside the transistor cell area, and a width w1 of the first elongated mask opening is set larger than a width w2 of the second elongated mask opening.

17. The method of claim 16, wherein a thickness h of the mask is set larger than w2/tan(α3).

18. A semiconductor device, comprising:
  a super junction structure in a semiconductor body, the super junction structure comprising a plurality of elongated n- and p-doped regions extending in parallel along a first lateral direction and alternately arranged along a second lateral direction,
  wherein a width of the elongated n-doped regions successively decreases from one of the elongated n-doped regions in an edge termination area to another one of the elongated n-doped regions in the edge termination area along the second direction, and a dose of the elongated n- and p-doped. regions decreases with decreasing width.

19. The semiconductor device of claim 18, wherein a width of the elongated p-doped regions successively decreases from one of the elongated p-doped regions in an edge termination area to another one of the elongated p-doped regions in the edge termination area along the second direction.

* * * * *